United States Patent [19]

Matsubara

[11] Patent Number: 5,953,632
[45] Date of Patent: Sep. 14, 1999

[54] METHOD FOR MANUFACTURING SEMICONDUCTOR DEVICE COMPRISING A SILICIDE FILM

[75] Inventor: Yoshihisa Matsubara, Tokyo, Japan

[73] Assignee: NEC Corporation, Tokyo, Japan

[21] Appl. No.: 08/889,492

[22] Filed: Jul. 8, 1997

[30] Foreign Application Priority Data

Jul. 17, 1996 [JP] Japan ................................. 8-187536

[51] Int. Cl.⁶ ............................................. H01L 21/28
[52] U.S. Cl. ........................ 438/683; 438/655; 438/664; 438/909
[58] Field of Search ................................ 438/630, 649, 438/651, 655, 664, 682, 683, 909; 748/DIG. 19

[56] References Cited

U.S. PATENT DOCUMENTS

| | | | |
|---|---|---|---|
| 4,782,380 | 11/1988 | Shankar et al. | 257/751 |
| 4,822,753 | 4/1989 | Pinchovski et al. | 438/643 |
| 5,399,526 | 3/1995 | Sumi | 438/652 |
| 5,573,961 | 11/1996 | Hsu et al. | 438/163 |

FOREIGN PATENT DOCUMENTS

| | | |
|---|---|---|
| 61-263159 | 11/1986 | Japan . |
| 62-298109 | 12/1987 | Japan . |
| 5-267212 | 10/1993 | Japan . |
| 6-45279 | 2/1994 | Japan . |

OTHER PUBLICATIONS

Tsukamoto, K., et al., "Self–Aligned Titanium silicidation of submicron MOS devices by rapid thermal annelaing", IEDM Tech. Digest, Dec. 1984, pp. 130–133.

*Primary Examiner*—T. N. Quach
*Attorney, Agent, or Firm*—Young & Thompson

[57] ABSTRACT

There is herein disclosed a self-align-silicide formation technique which can be applied to miniaturized semiconductor elements. Heat treatment steps for silicidation of a high-melting metal film are two steps of a first heat treatment under an atmosphere containing no nitrogen and a second heat treatment under an atmosphere containing nitrogen. The first heat treatment is carried out under the atmosphere containing no nitrogen, whereby the nitriding of titanium can be restrained. In consequence, the thin silicide film can be formed in a self align state.

13 Claims, 11 Drawing Sheets a)

b)

a)

b)

The values in the table mean arsenic injection doses.

The values in the table mean arsenic injection doses.

METHOD FOR MANUFACTURING SEMICONDUCTOR DEVICE COMPRISING A SILICIDE FILM

BACKGROUND OF THE INVENTION (i) Field of the Invention

The present invention relates to a method for manufacturing a semiconductor device, and more particularly, it relates to a method for forming a silicide film of a high-melting metal in self alignment on a diffusion layer or a gate electrode of a MOS transistor.

(ii) Description of the Related Art

The miniaturization and the high densification of semiconductor elements have energetically been advanced, and nowadays, super-highly integrated semiconductor devices such as memory devices and logic devices designed at a size level of 0.15 to 0.25 $\mu$m have been made. With the high integration of such semiconductor devices, it has gotten more important more and more to decrease the width of gate electrodes and the width of diffusion layers and to reduce the thickness of materials constituting the semiconductor elements. However, the decrease of the width of the gate electrodes and gate electrode wires and the reduction of the thickness of gate electrode materials inevitably give rise to the increase of wiring resistance and have a large influence on the circuit delay. For the solution of these problems, it is an essential technique to lower the resistance of the gate electrodes by the utilization of a high-melting metal silicide. In particular, a self-align-silicide formation technique using titanium metal as the high-melting metal has become an extremely important technique for the miniaturization of MOS transistors.

A first conventional manufacturing method of the MOS transistor having a self-aligned-silicide structure will be described with reference to FIGS. 5 and 6. In the first place, as shown in FIG. 5(a), an element separation insulating film 502 is formed in a predetermined area on a silicon substrate 501 by a known LOCOS method. Next, an ion implantation of an impurity for a channel stopper is conducted, and a gate insulating film 503 is then formed by a thermal oxidation method. Next, a polysilicon film having a thickness of about 150 nm is formed all over by a CVD (chemical vapor deposition) method, and then doped with an impurity such as phosphorus. Afterward, the thus doped polysilicon film is patterned into a desired shape by a lithography technique and a dry etching technique to form a gate electrode 504. Next, a silicon oxide film is deposited all over the surface of the substrate by the CVD method, followed by anisotropic dry etching, to form a spacer 505 on the side of the gate electrode 504. Next, an impurity such as arsenic or boron is injected into the silicon oxide film, and a heat treatment is then carried out at 800 to 1000° C. to form a diffusion layer 506. Here, in the case that the MOS transistor is an n-channel type, the diffusion layer containing arsenic is formed, or in the case that the MOS transistor is a p-channel type, the diffusion layer containing boron is formed. The thus formed diffusion layer becomes a source drain region of the transistor.

Next, as shown in FIG. 5(b), a titanium film 507 having a thickness of about 50 nm is formed all over by a sputtering process or the like. successively, a heat treatment is carried out for a period of 30 to 60 seconds under atmospheric pressure in a nitrogen atmosphere. Here, the heat treatment under the nitrogen atmosphere plays a role for forming a self aligned structure of titanium silicide. By the heat treatment under the nitrogen atmosphere after the formation of the titanium film 507, the silicide formation and the nitriding of titanium occur simultaneously, but for titanium on the oxide film, the nitriding alone proceeds and the silicide formation does not proceed, whereby the self aligned structure of titanium silicide can be realized. As a heat treatment apparatus, a lamp annealing apparatus is usually used, and a heat treatment temperature is set in the range of 600 to 650° C. In this way, the silicidation of titanium can be carried out. On the exposed surface of the gate electrode 504 and the surface of the diffusion layer 506, a C49 structure silicide layer 509 of a crystalline structure having a high electric resistivity of about 60 $\mu\Omega$·cm and titanium nitride 508 are formed, as shown in FIG. 5(c).

Next, as shown in FIG. 6(a), the above-mentioned titanium nitride layer 508 is removed with a chemical agent solution obtained by mixing an aqueous ammonia solution, pure water and a hydrogen peroxide liquid. By passing through the above-mentioned steps, the C49 structure silicide layer 509 can be formed only on the gate electrode 504 and the diffusion layer 506 which defines the source-drain region. Furthermore, a second heat treatment is carried out under atmospheric pressure in a nitrogen atmosphere for about 60 seconds. Here, as a heat treatment apparatus, the above-mentioned lamp annealing apparatus is used, and a treatment temperature is set to about 850° C. By this treatment, the above-mentioned C49 structure silicide layer 509 changes into a C54 structure silicide layer 510 of a crystalline structure having a low electric resistivity of about 20 $\mu\Omega$·cm, as shown in FIG. 6(b).

In the case that a silicidation technique is applied to the MOS transistor, it is required that the diffusion of the impurity for the formation of the diffusion layer is restrained and a short channel effect of the transistor is restrained in compliance with the high integration of the semiconductor device. As a result, when a junction face of the diffusion layer comes in contact with the silicide region layer, a crystal defect leak current increases, so that the switch operation of the transistor is poor. Therefore, with the formation of the thin junction of the diffusion layer, the formation of the thin silicide film is essential.

However, when the formation of the thin silicide film is attempted, it is difficult to form such a thin silicide film by a conventional technique. This is based on a fact that, in the heat treatment in the nitrogen atmosphere after the formation of the titanium film 507, a reaction rate of the nitriding is higher than that of the silicide reaction, and so, in the case that the thin titanium layer is used, the whole titanium filth is nitrided and the silicide film is not formed. In particular, in the case that arsenic impurity is contained in silicon, the silicide reaction rate is further low, and the reaction rate of the titanium nitride formation relatively increases. In consequence, the thickness of the silicide film extremely decreases.

The above-mentioned phenomenon will be described in more detail. FIG. 7 shows the dependence of a silicide formation rate on an impurity concentration. From the drawing, it is apparent that as the concentration of the impurity injected into silicon is high, the formation rate of the silicide is low. It can be presumed that this phenomenon is due to a fact that, as the concentration of the impurity is high, a monosilicide is stabilized, so that a time taken for the change of the monosilicide into a disilicide in the silicide reaction (a latent time) is prolonged. On the other hand, if the heat treatment for the silicide reaction is done under the nitrogen atmosphere, the nitriding reaction of titanium takes place together with the silicide reaction. The dependence of this nitriding reaction cf titanium on the impurity concentration is shown in FIG. 8. As is apparent from the drawing, the dependence of the nitriding reaction on the impurity concentration in silicon is low, because the nitriding reaction occurs due to the diffusion of nitrogen in titanium. As understood from the above, when the impurity is injected at a high concentration, the nitriding reaction of titanium is relatively faster than the silicide formation reaction. For example, in a silicon board in which the impurity is injected at a high concentration of about $5 \times 10^{15}$ ions/cm$^2$ into the thin titanium film having a thickness of 20 nm or less, the silicide reaction scarcely proceeds and hence the nitriding reaction alone of titanium takes place. As understood from this fact, there has been a problem that the lower limit of the thickness of the titanium film which permits the formation of the thin silicide film naturally depends on the concentration of the impurity.

SUMMARY OF THE INVENTION

As described above, a heat treatment under a nitrogen atmosphere in the above-mentioned technique is an essential step to form a self align structure of titanium silicide. In this step, therefore, it is a particularly important theme for the achievement of the formation of a thin silicide film that a silicide is formed, restraining the nitriding of titanium. The present invention intends to provide a method for manufacturing a semiconductor device by which such a theme can be achieved.

A method for manufacturing a semiconductor device which comprises a step of forming a silicide film, characterized by comprising a step of forming a high-melting metal film on a predetermined surface of silicon, polysilicon or silicon oxide constituting a part of the semiconductor device, a step of carrying out a first heat treatment under an atmosphere containing no nitrogen so that a part of the high-melting metal film may be converted to a silicide film, and a step of carrying out a second heat treatment for a growth of the silicide film under an atmosphere containing nitrogen.

By the method for manufacturing a semiconductor device of the present invention, a part of the high-melting metal film is converted to a silicide film before nitriding of the high-melting metal film by the said second heat treatment. So a silicide is formed, restraining the nitriding of titanium.

DETAILED DESCRIPTION OF THE PREFERRED EMBODIMENTS

Figure 1:
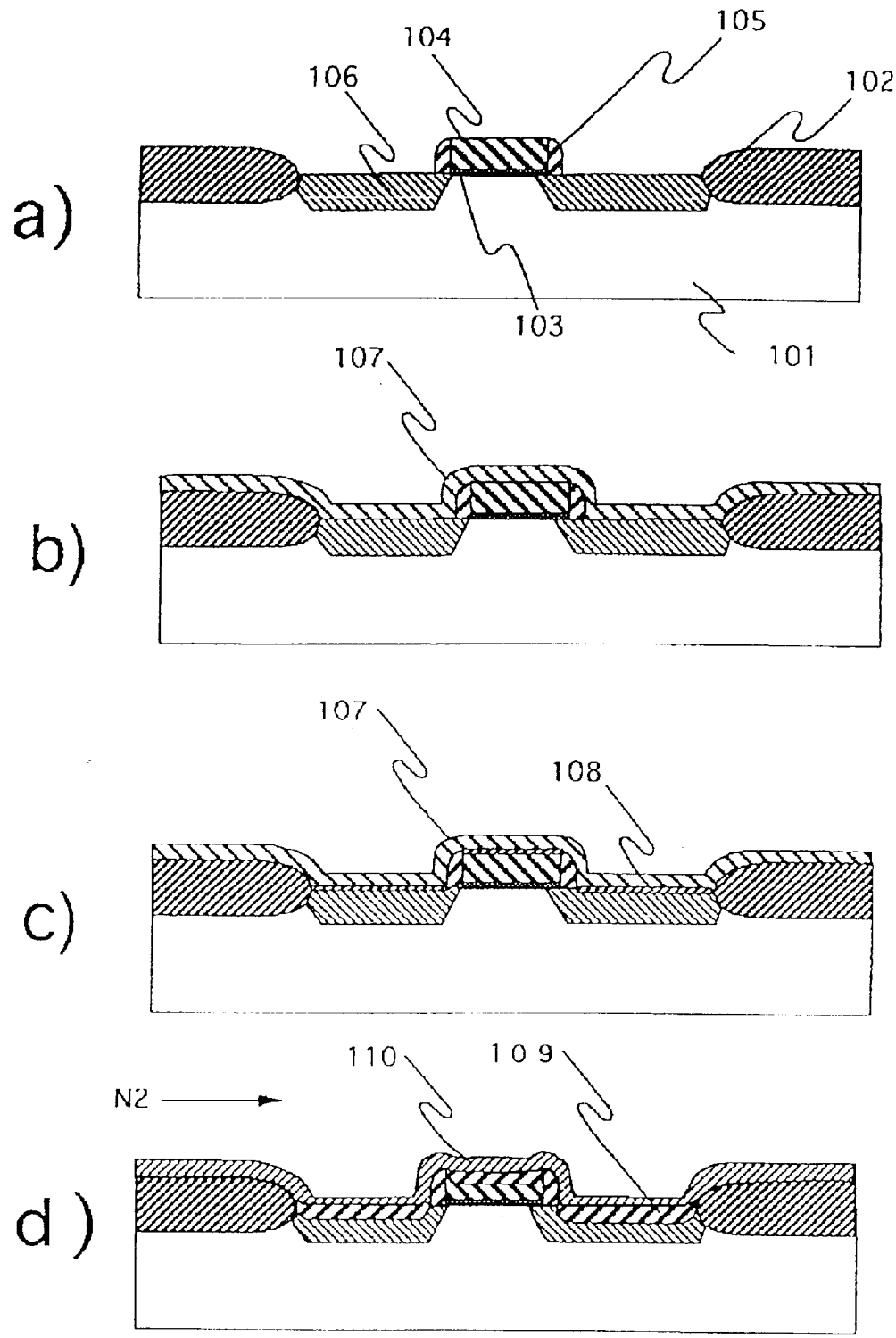
FIGS. 1a)–1d) are a step sectional view for illustrating a first example of the present invention.
Figure 2:
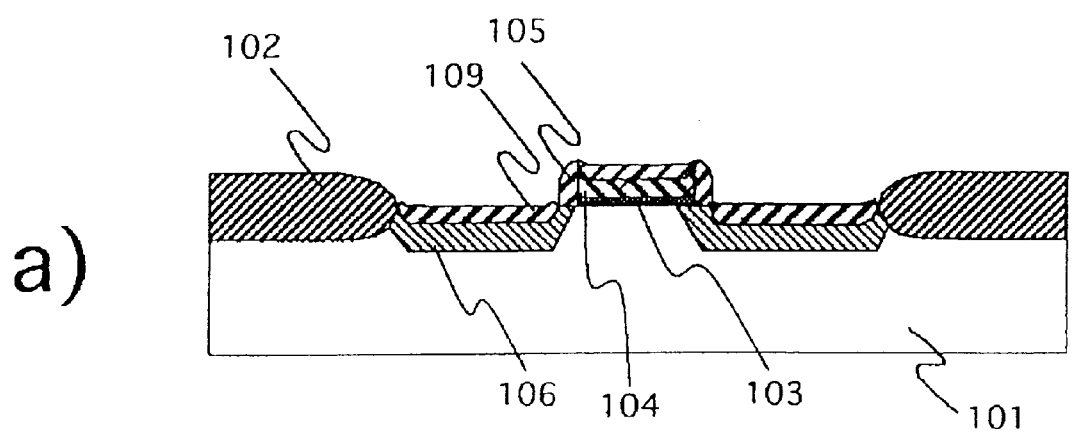
FIGS. 2a) and 2b) are a step sectional view for illustrating the first example of the present invention.
Figure 2:
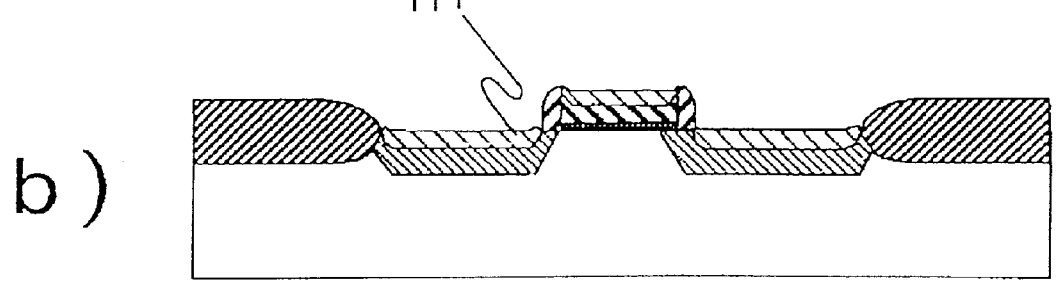

One example of practical embodiments regarding the present invention will be described with reference to the drawing figures. FIGS. 1 and 2 show examples in which a manufacturing method of the present invention is applied to an MOS transistor.

Figure 5:
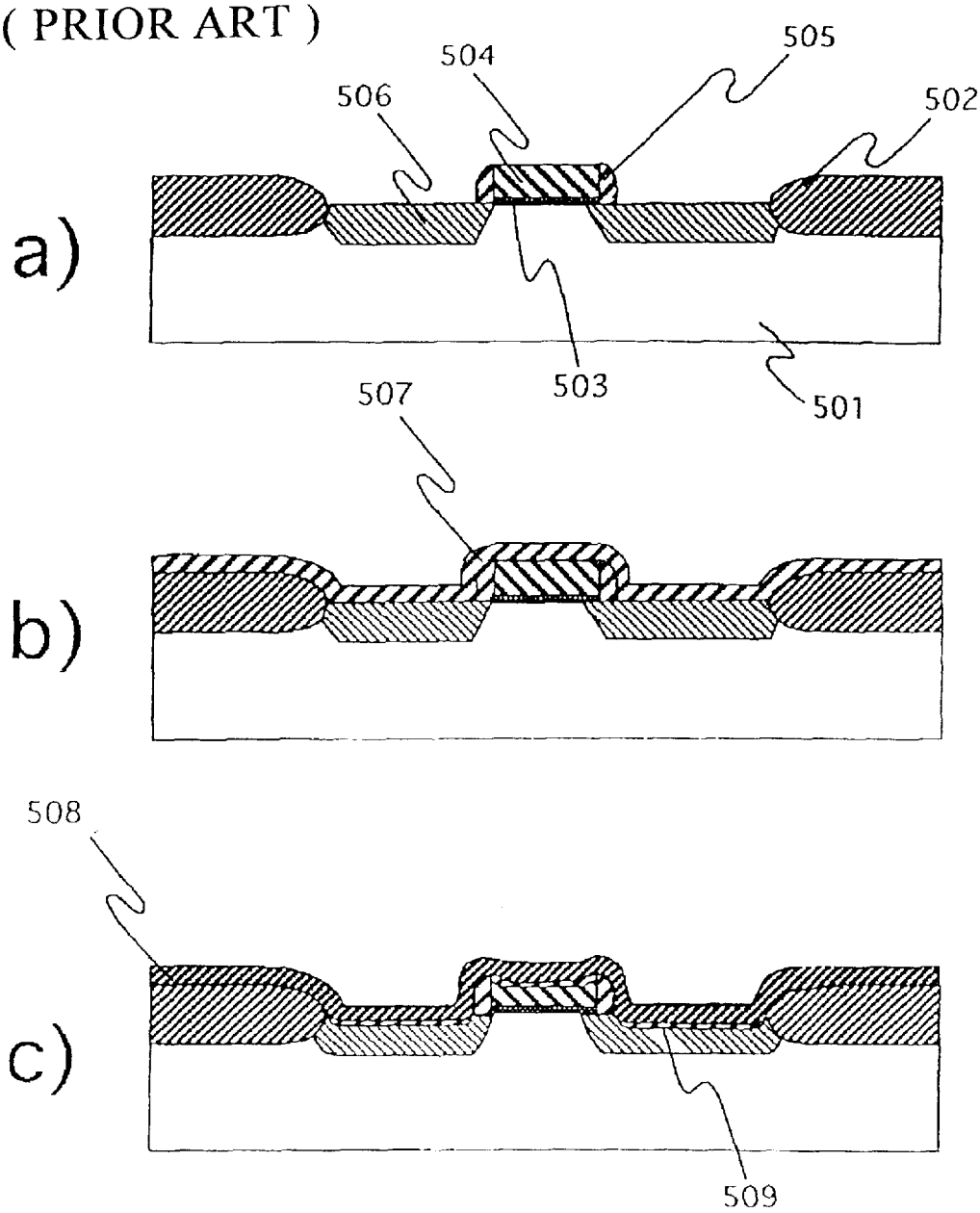
FIGS. 5a)–5c) are a step sectional view for illustrating a first conventional technique.
Figure 6:
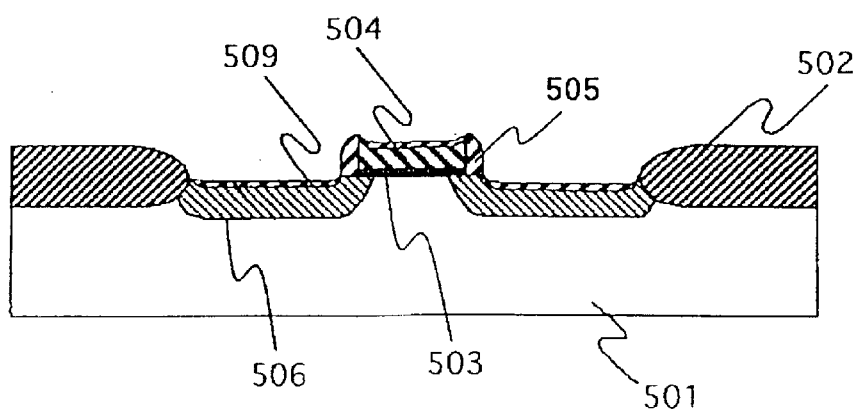
FIGS. 6a) and 6b) a step sectional view for illustrating the first conventional technique.
Figure 6:
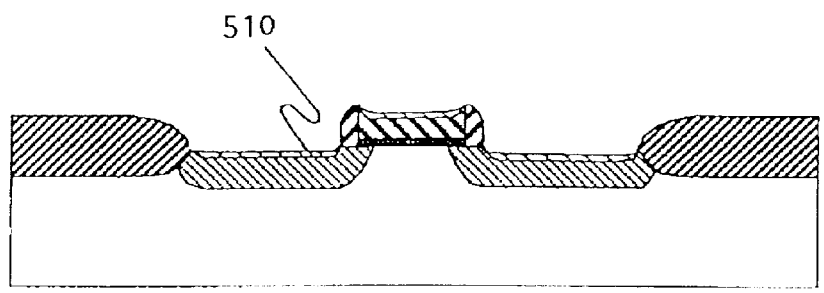
Figure 7:
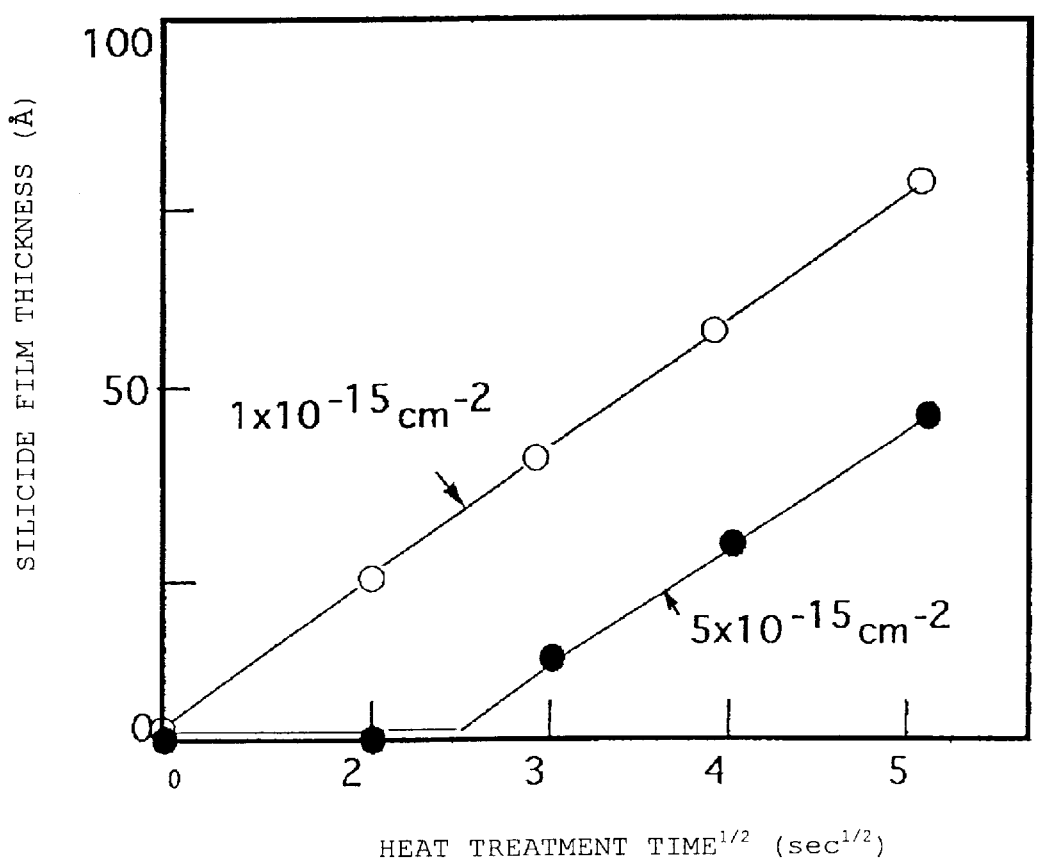
FIG. 7 shows the dependence of a silicide film thickness on an impurity concentration.
Figure 8:
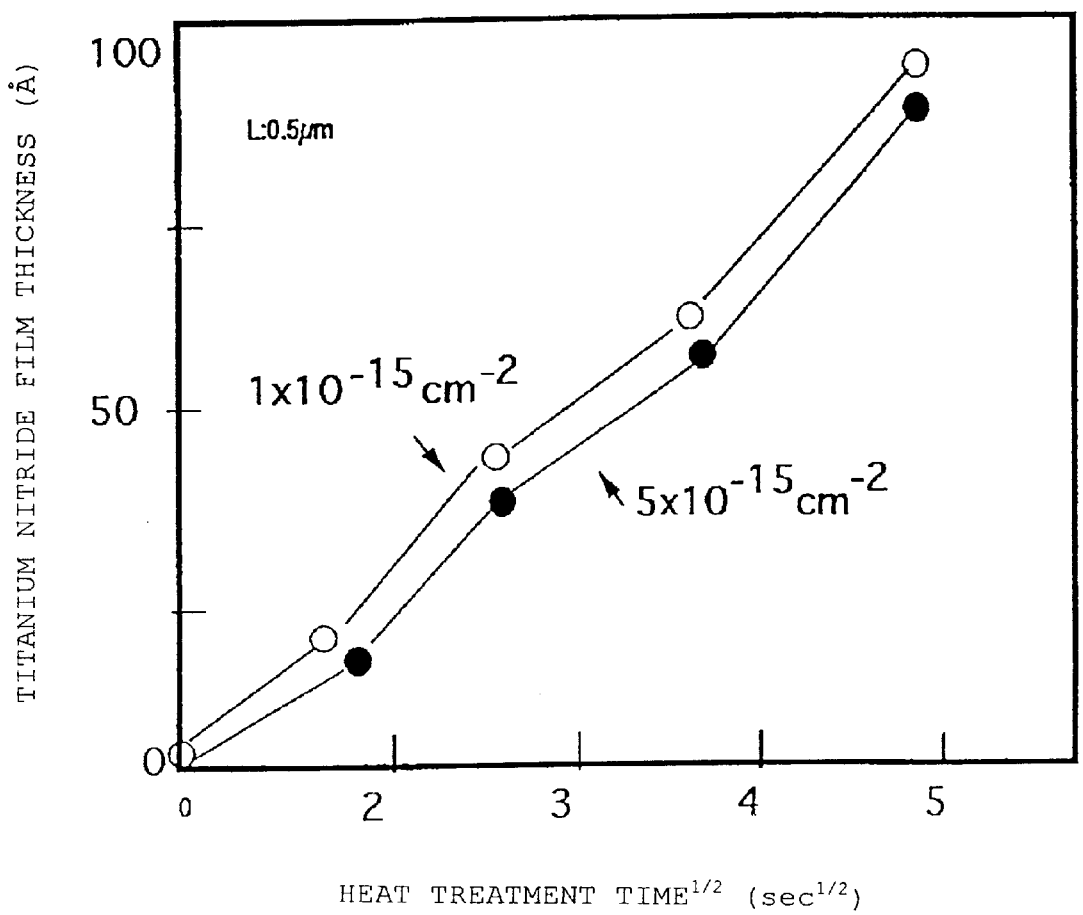
FIG. 8 shows the dependence of a titanium nitride film thickness on the impurity concentration.

In the first place, a titanium film 107 is formed all over a substrate provided with a gate electrode by the same conventional technique as shown in FIG. 5 [FIGS. 1(a) and 1(b)].

Figure 9:
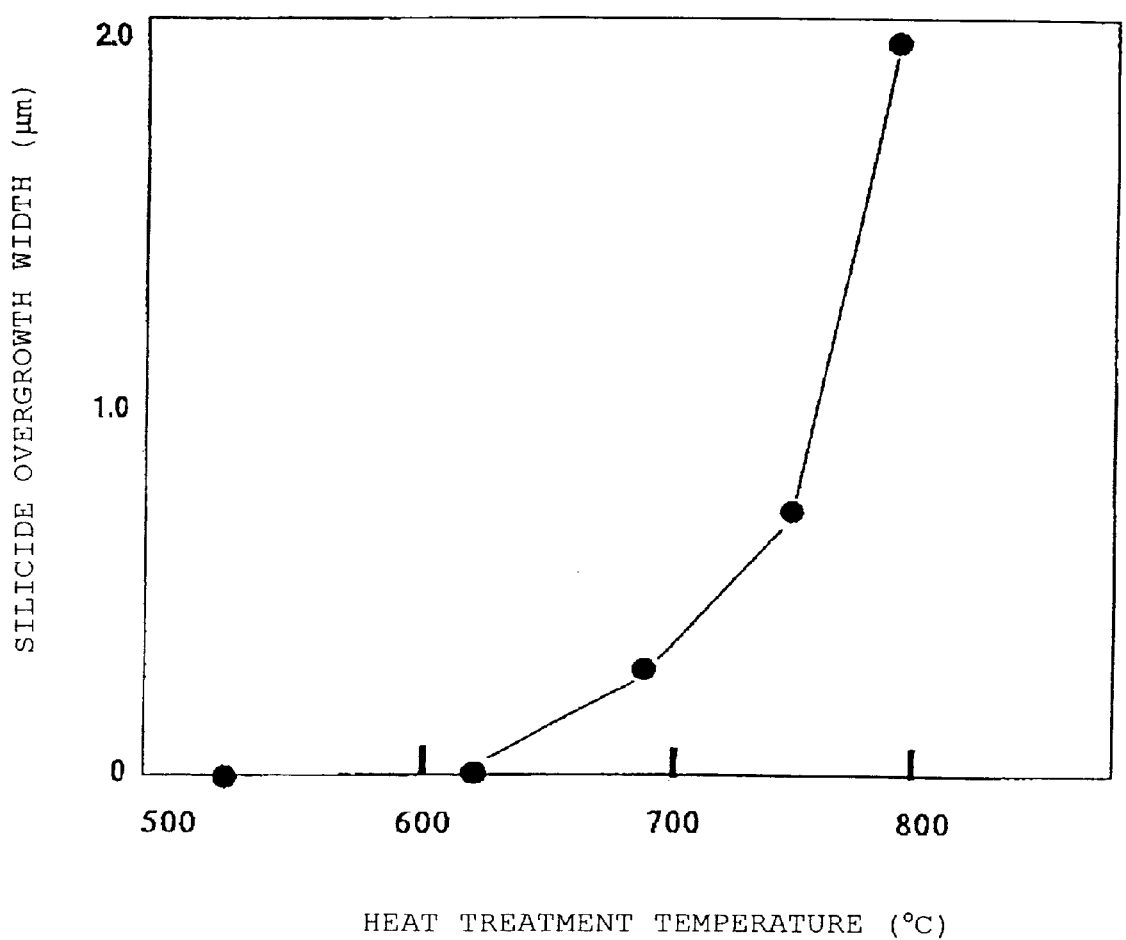
FIG. 9 shows the influence of a heat treatment temperature on the width of a silicide overgrowth formed on an oxide film.

In succession, as shown in FIG. 1(c), a first heat treatment is carried out to form a monosilicide 108. An atmosphere for the heat treatment is preferably an argon atmosphere or vacuum. A heat treatment temperature is required to be set so that the diffusion of silicon onto an oxide film (hereinafter referred to as "the overgrowth") may be restrained, and hence it is preferably in the range of 500 to 600° C. If the heat treatment temperature is less than 500° C., the formation of a silicide is difficult. On the other hand, if it is more than 600° C., the overgrowth is generated, so that the self-align-silicide cannot be formed. With respect to this point, FIG. 9 shows a relation between the width of the silicide overgrowth formed on the oxide film and the heat treatment temperature. It is apparent that, when the heat treatment is carried out at more than 600° C., the overgrowth is generated.

Next, as shown in FIG. 1(d), the heat treatment is carried out in a nitrogen atmosphere to form the silicide. Since the monosilicide layer is formed in the previous step, the nitriding of titanium is restrained, so that a silicide reaction is promoted. Between the heat treatment step under the argon atmosphere and the heat treatment step under the nitrogen atmosphere, a step for forming a surface oxide film may be interposed, whereby a titanium nitriding reaction can be further restrained and the formation of the silicide can be promoted. The surface oxide film can be formed, for example, by exposing the monosilicide layer to an atmosphere containing about 1 mTorr of oxygen. Next, a titanium nitride film 110 is removed as shown in FIG. 2(a), and a silicide film 111 having a low electric resistivity is then formed by a heat treatment as shown in FIG. 2(b).

EXAMPLE 1

FIGS. 1 and 2 show an example where a method of the present invention is applied to an MOS transistor. Until a step of forming a titanium film in accordance with a sputtering process of FIG. 1(b), a conventional technique shown in FIG. 5 is used. That is to say, as shown in FIG. 1(a), an element separating insulating film 102 having a thickness of 300 nm is formed, by a known LOCOS method, on a predetermined region of a silicon substrate 101 provided with a p-conductive type or a p-well. Next, ions of boron impurity for a channel stopper are injected, and a gate insulating film 103 having a thickness of about 8 nm is then formed by a thermal oxidation method. Next, a polysilicon film having a thickness of about 100 nm is formed all over by a CVD method, and then doped with an impurity such as phosphorus. Afterward, the polysilicon film is patterned into a desired shape by the use of a lithography technique and a dry etching technique, whereby a gate electrode 104 is formed. Next, a silicon oxide film having a thickness of about 100 nm is deposited all over by the CVD method, and in succession, anisotropic dry etching is carried out to form a spacer 105 on the side of the gate electrode 104. Next, ions of arsenic impurity are injected, and a diffusion layer 106 is then formed by a heat treatment of about 900° C. An arsenic injection dose is about $4 \times 10^{15}/cm^2$. In this way, a source-drain region of the MOS transistor can be defined. Next, as shown in FIG. 1(b), a titanium film 107 having a thickness of about 20 nm is formed by a sputtering process of titanium or the like.

In succession, as shown in FIG. 1(c), the heat treatment is carried out at 550° C. for 30 seconds in an argon gas atmosphere to form a monosilicide 108 having a thickness of about 5 nm. Next, as shown in FIG. 1(d), the heat treatment is carried out at 700° C. for 30 seconds in a nitrogen atmosphere to form a C49 structure silicide film 109 having a thickness of about 30 nm. Next, as shown in FIG. 2(a), a titanium nitride film 110 is removed with a solution containing aqueous ammonia and a hydrogen peroxide liquid. Next, as shown in FIG. 2(b), the heat treatment is carried out at 800° C. for 10 seconds to form a C54 structure silicide layer 111 having a low electric resistivity.

Figure 10:
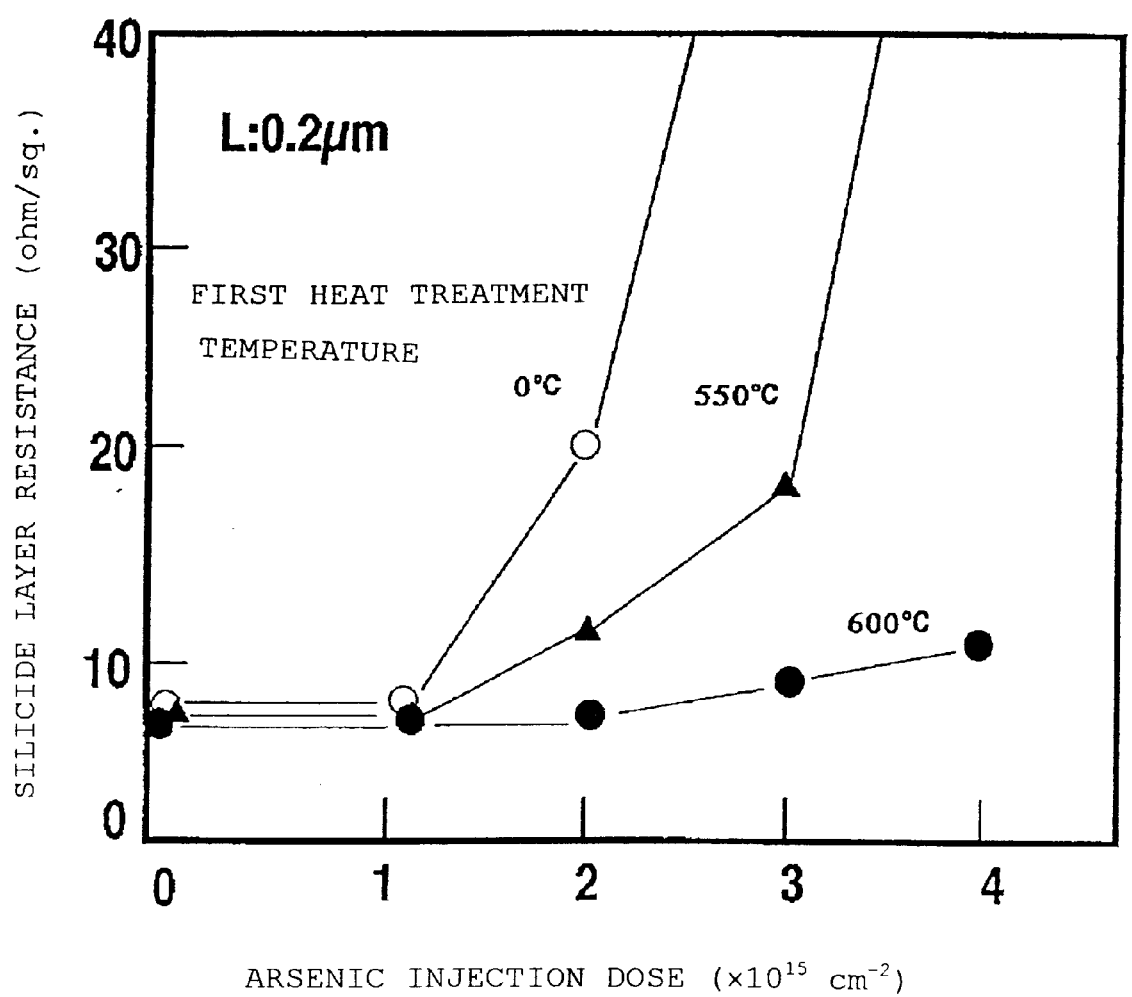
FIG. 10 shows the influence of an arsenic injection dose on a resistance of the silicide film.

The dependence of a resistance of the thus formed silicide film on the arsenic injection dose is shown in FIG. 10. In the case that the first heat treatment is not carried out (the case of 0° C. in the drawings), the silicide film is not formed when arsenic is injected in an amount of $3 \times 10^{15}$ ions/cm$^2$ or more, so that the film resistance rises. In the case that the temperature of the first heat treatment is raised, the silicide layer resistance correspondingly lowers. Thus, it is apparent that even if the dose is large, the resistance can be lowered.

EXAMPLE 2

Figure 3:
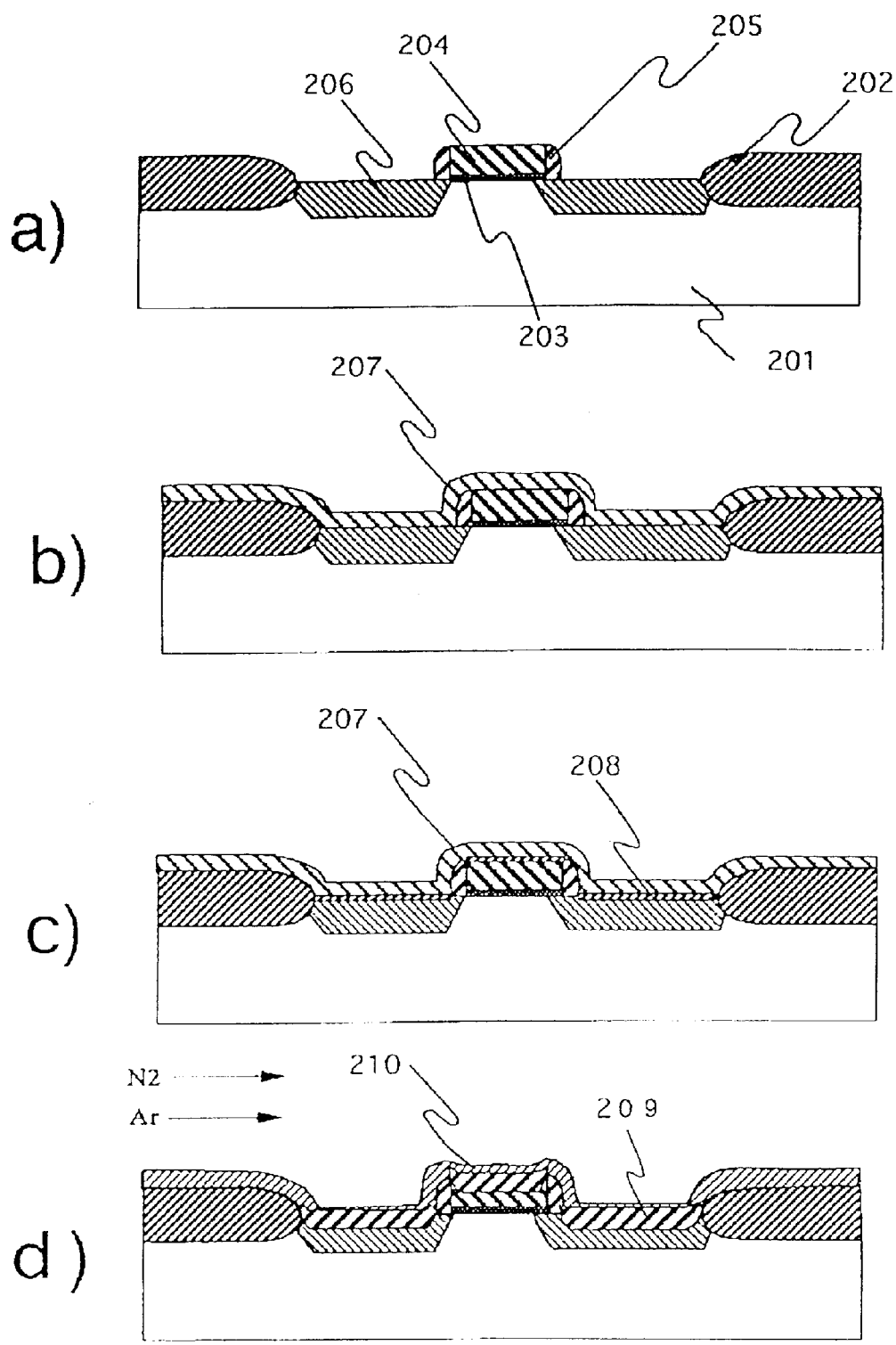
FIGS. 3a)–3d) are a step sectional view for illustrating a second example of the present invention.
Figure 4:
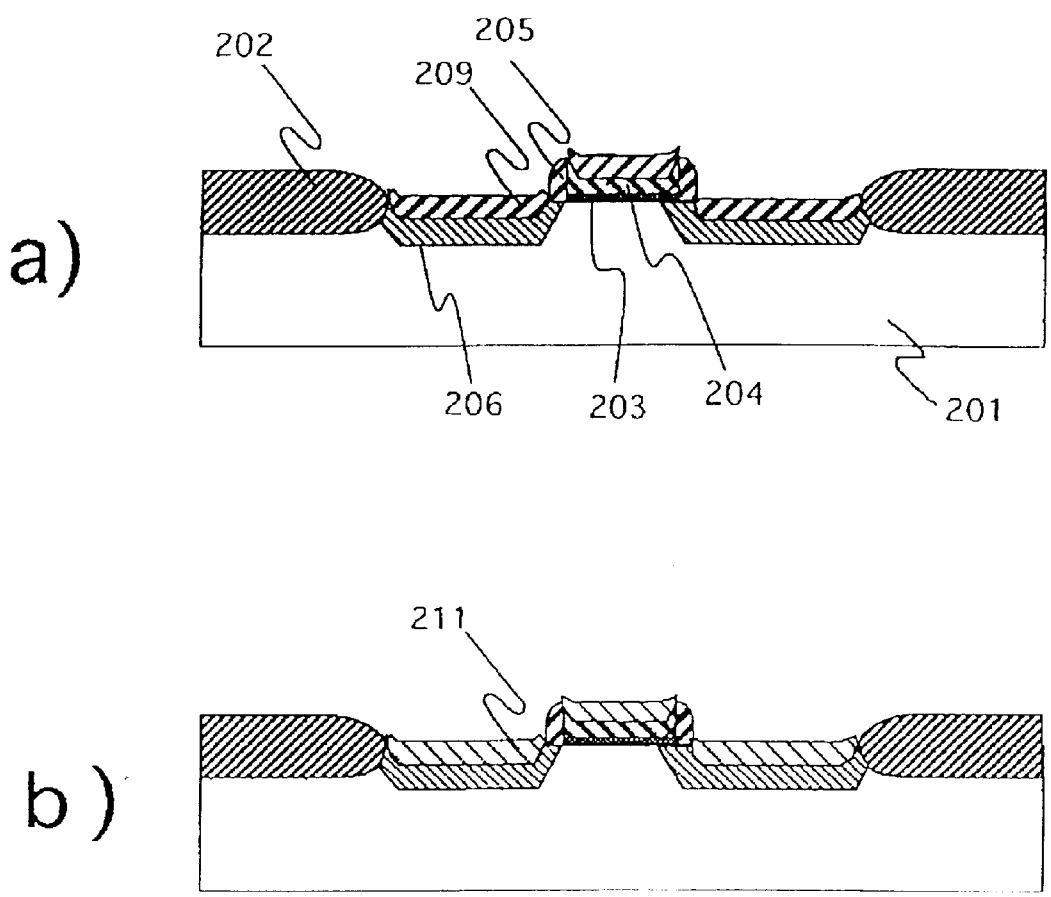
FIGS. 4a) and 4b) are a step sectional view for illustrating the second example of the present invention.

Next, a second example of the present invention will be described in detail with reference to drawings. FIGS. 3 and 4 are step sectional views of the second example in which a second heat treatment is carried out in a nitrogen atmosphere under reduced pressure for the formation of a silicide. Steps until FIG. 3(c) are the same as the steps until FIG. 1(c) of the first example. That is to say, as shown in FIG. 3(a), an element separating insulating film 202 having a thickness of 300 nm is formed, by a known LOCOS method, on a predetermined region of a silicon substrate 201 provided with a p-conductive type or a p-well. Next, ions of boron impurity for a channel stopper are injected, and a gate insulating film 203 having a thickness of about 8 nm is then formed by a thermal oxidation method. Next, a polysilicon film having a thickness of about 100 nm is formed all over by a CVD method, and then doped with an impurity such as phosphorus. Afterward, the polysilicon film is patterned into a desired shape by the use of a lithography technique and a dry etching technique, whereby a gate electrode 204 is formed. Next, a silicon oxide film having a thickness of about 100 nm is deposited all over by the CVD method, and in succession, anisotropic dry etching is carried out to form a spacer 205 on the side of the gate electrode 204. Next, ions of arsenic impurity are injected, and a diffusion layer 206 is then formed by a heat treatment of about 900° C. An arsenic ions injection dose is about $4 \times 10^{15}/cm^2$. In this way, a source-drain region of the MOS transistor can be defined. Next, as shown in FIG. 3(b), a titanium film 207 having a thickness of about 20 nm is formed by a sputtering process of titanium or the like. In succession, as shown in FIG. 3(c), a heat treatment is carried out at 550° C. for 30 seconds in an argon gas atmosphere to form a monosilicide 208 having a thickness of about 5 nm. Next, as shown in FIG. 3(d), a heat treatment is carried out in a nitrogen atmosphere diluted with argon to form a C49 structure silicide film 209. At this time, a nitrogen pressure is lower as compared with that of a conventional method, and therefore a nitrogen concentration of a titanium nitride film formed on the surface of the titanium film decreases. In consequence, the formation of the titanium nitride film is restrained, so that the formation of titanium silicide is predominant, with the result that the thickness of the silicide film increases. In this example, as a technique for lowering a nitrogen partial pressure in the second heat treatment, the dilution of nitrogen with an argon gas is carried out, but simply reducing the nitrogen gas pressure can also be done, and also in this case, a similar effect can be obtained.

Figure 11:
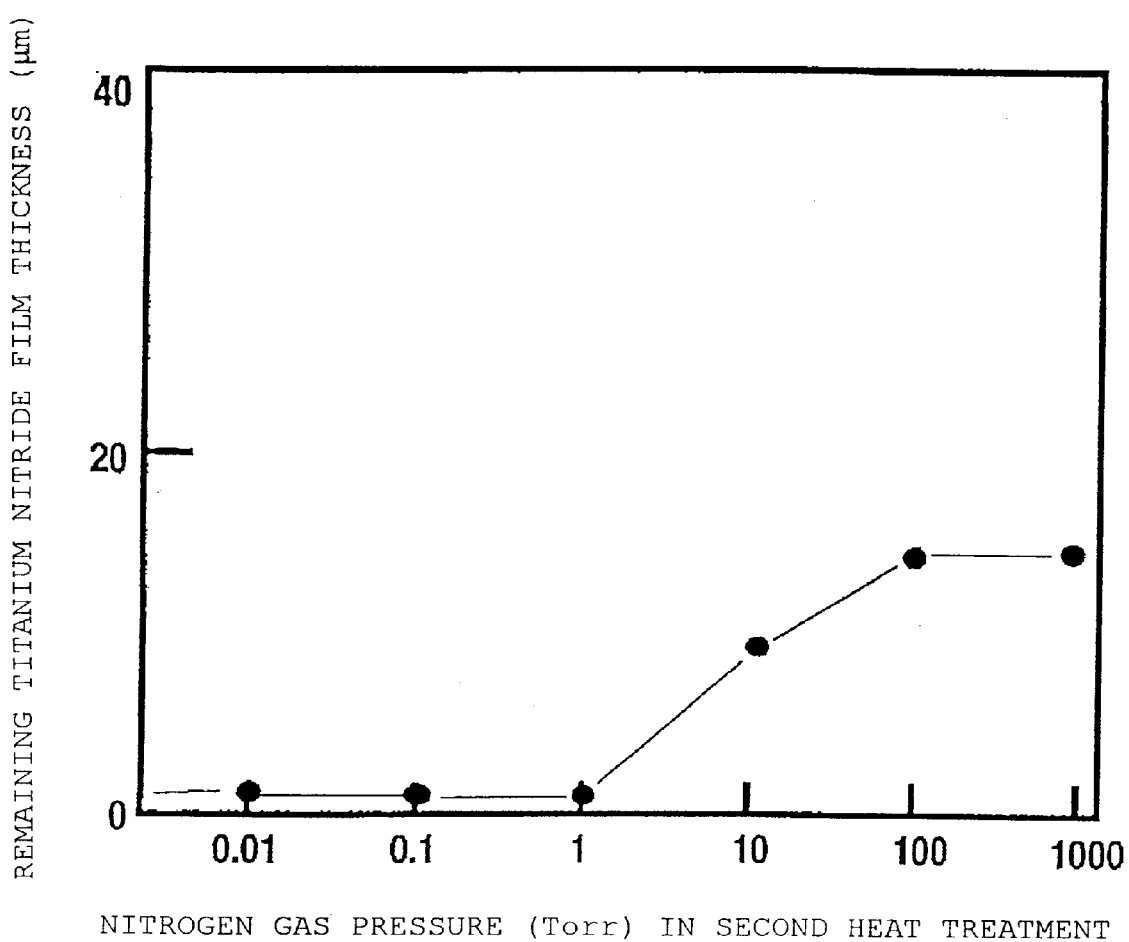
FIG. 11 shows the influence of a nitrogen gas pressure at a second heat treatment on a remaining film thickness of a nitrogen-containing titanium film.

In succession, as shown in FIG. 4(a), a nitrogen-containing titanium film 210 in which the nitrogen concentration is lowered is removed with a solution containing aqueous ammonia and a hydrogen peroxide liquid. Afterward, as shown in FIG. 4(b), a heat treatment is carried out at 800° C. for 10 seconds to form a C54 structure silicide layer 211 having a low electric resistivity. When a nitrogen content is high, the removal of the nitrogen-containing titanium film is difficult. This fact will be described with reference to FIG. 11, which shows a relation between a remaining film thickness of a nitrogen-containing titanium film subjected to the etching treatment with the above-mentioned chemical agent and the nitrogen gas pressure at the second heat treatment. As is apparent from this drawing, when the nitrogen gas pressure is high, the removal of the nitrogen-containing titanium film 210 is difficult. If the nitrogen gas pressure is 1 Torr or less, this film 210 can substantially completely be removed. In view of this fact, the nitrogen gas pressure in the second heat treatment of the present invention is preferably set to 1 Torr or less. In this connection, the suitable range of the nitrogen gas pressure is not so affected by an initial titanium film thickness.

As described above, the present invention is characterized by comprising a step of forming a high-melting metal film on a predetermined surface of silicon, polysilicon or silicon oxide constituting a part of a semiconductor device, a step of carrying out a first heat treatment under an atmosphere containing no nitrogen so that a part of the high-melting metal film may be silicified, and a step of carrying out a second heat treatment under an atmosphere containing nitrogen for growth of the part of the high-melting metal film previously may be silicified. After removal of the resulting titanium nitride film, final heat treatment transform the C49 silicide film into a C54 silicide layer. Since the first heat treatment is carried out in the atmosphere containing no nitrogen, the nitriding of titanium can be restrained, and a self-align-silicide can be formed on silicon doped with an impurity at a high concentration.

What is claimed is:

1. A method for manufacturing a semiconductor device which comprises a step of forming a silicide film, said step of forming a silicide film comprising: a step of forming a high-melting metal film on a predetermined surface of silicon, polysilicon or silicon oxide constituting a part of the semiconductor device, a step of carrying out a first heat treatment under an atmosphere containing no nitrogen so that a part of the high-melting metal film may be converted to a silicide film, and a step of carrying out a second heat treatment for growth of the silicide film under a nitrogen enriched atmosphere between 0.01 Torr and approximately 1 Torr.

2. The method for manufacturing a semiconductor device according to claim 1 wherein the step of carrying out the first heat treatment is done at a temperature of 500 to 600° C. for approximately 30 seconds.

3. The method for manufacturing a semiconductor device according to claim 1 wherein the step of carrying out the first heat treatment is done under an atmosphere containing argon.

4. The method for manufacturing a semiconductor device according to claim 1 wherein the step of carrying out the first heat treatment is done under vacuum.

5. The method for manufacturing a semiconductor device according to claim 1 wherein after the step of carrying out the first heat treatment, an oxide film is formed on the surface of the silicified high-melting metal film, and the second heat treatment is then carried out.

6. The method for manufacturing a semiconductor device according to claim 1 wherein the high-melting metal film is a film having a thickness of 30 nm or less and containing titanium.

7. The method of claim 1, comprising the additional steps of:

removing a nitride film formed on said silicide film; and providing a third heat treatment to convert said silicide film to a silicide layer.

8. The method of claim 7, wherein said silicide film is a C49 structure silicide film and said silicide layer is a C54 structure silicide layer.

9. The method of claim 8, wherein said third heat treatment is carried out at approximately 800° C. for approximately 10 seconds.

10. The method of claim 9, wherein the second heat treatment is carried out in an atmosphere enriched with both nitrogen and argon.

11. In a method for forming a semiconductor metal silicide layer comprising the steps of forming a C49 structure silicide film by a first heat treating a metal layer, removing a nitride film formed on said silicide film, and transforming said C49 structure silicide film into a C54 structure silicide layer by a further heat treatment, the improvement comprising:

performing a first step of said first heat treating in a nitrogen-free atmosphere so that portions of said metal layer contacting silicon forms a monosilicide; and performing a second step of said first heat treating in a nitrogen atmosphere to form a C49 structure silicide film, said nitrogen atmosphere being maintained between 0.01 Torr and approximately 1 Torr.

12. The method of claim 11, wherein said first step is performed at a temperature in the range of 500° to 600° C. for approximately 30 seconds, said second step is preformed at a temperature 700° for approximately 30 seconds and said further heat treatment is performed at a temperature of 800° for approximately 10 seconds.

13. The method of claim 11, wherein said monosilicate is formed to a thickness of about 5 nm, and said silicide film is formed to a thickness of about 30 nm.

* * * * *